United States Patent [19]

Yamashita et al.

[11] 4,321,155

[45] Mar. 23, 1982

[54] PIEZOELECTRIC OXIDE MATERIAL

[75] Inventors: Youhachi Yamashita, Kawasaki; Katsunori Yokoyama, Ebina; Tadashi Ido, Yokohama; Seiichi Yoshida, Higashitateishi, all of Japan

[73] Assignee: Tokyo Shibaura Denki Kabushiki Kaisha, Kawasaki, Japan

[21] Appl. No.: 235,639

[22] Filed: Feb. 18, 1981

[30] Foreign Application Priority Data

Feb. 18, 1980 [JP] Japan .................................. 55-17911

[51] Int. Cl.$^3$ ............................................. C04B 35/46
[52] U.S. Cl. .................................................. 252/62.9
[58] Field of Search ....................................... 252/62.9

[56] References Cited

U.S. PATENT DOCUMENTS 3,630,909 12/1971 Banno et al. ........................ 252/62.9
4,224,174 9/1980 Okuma et al. ...................... 252/62.9
4,228,482 10/1980 Bouchard et al. ............. 252/69.9 X

FOREIGN PATENT DOCUMENTS 895207 3/1972 Canada .............................. 252/62.9
2019584 7/1970 France .
2332962 6/1977 France .
49-20158 5/1974 Japan .
55-43802 3/1980 Japan ................................. 252/62.9

OTHER PUBLICATIONS

Journal of The American Ceramic Society—Hiromu Ouchi—vol. 51, No. 3, pp. 169–176, Mar. (1968) "Pb(Mg.Nb)O$_3$–PbTiO$_3$–PbZrO$_3$ Ceramic with Ba or Sr Substitute".

*Primary Examiner*—Jack Cooper
*Attorney, Agent, or Firm*—Oblon, Fisher, Spivak, McClelland & Maier

[57] ABSTRACT

A piezoelectric oxide material suitable for an ultrasonic probe is provided. The piezoelectric material has the general formula

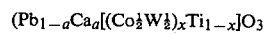

$(Pb_{1-a}Ca_a[(Co_{\frac{1}{2}}W_{\frac{1}{2}})_xTi_{1-x}]O_3$ wherein $0.01 \leq X \leq 0.10$ and $0.20 \geq a \leq 0.35$, to which is added, as an additive, 0.05 to 2.0% by weight of at least one of MnO, NiO and Fe$_2$O$_3$ based on the total content of the basic composition; the thickness coupling factor (Kt) is 50% or more; the ratio (Kt/Kp) of the thickness coupling factor (Kt) to the planar coupling factor (Kp) is 10 or more.

4 Claims, 5 Drawing Figures

PIEZOELECTRIC OXIDE MATERIAL

The present invention relates to a piezoelectric oxide material and, more particularly, to a $PbTiO_3$ type piezoelectric material suitable for ultrasonic probes.

Various types of ultrasonic probes using piezoelectric oxide materials have been developed recently. For these applications, materials are also being developed which consist of $PbTiO_3$—$PbZrO_3$ binary system or

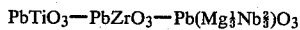

ternary system with additives such as $Cr_2O_3$, $MnO_2$ and NiO. However, these piezoelectric materials have dielectric constants as large as 350 to 2,000 and are not suitable for high frequency applications. Furthermore, when these materials are used in high frequency region, the coupling factor Kt in the thickness mode substantially equals the coupling factor Kp in the planar mode. This results in spurious response due to overtones determined by the planar coupling factor Kp. Therefore, it has been considered preferable that these materials have as high a ratio of Kt/Kp as possible for high frequency application.

$PbTiO_3$ type materials having anisotropic coupling factors are reported. According to these materials, the value of thickness coupling factor Kt greatly differs from the planar coupling factor Kp of those materials. However, the sintered body is fragile due to cracks caused in sintering and therefore a large sintered body of over 20 mm diameter cannot be obtained. Further, the poling (polarization) must be performed at severe conditions such as 60 kV/cm at 200° C. This tends to cause spark breakdown of samples and makes it difficult to obtain a large vibrator.

With conventional $PbTiO_3$ materials, further more the thickness coupling factor Kt is 40 to 48%, and the planar coupling factor Kp is above 8%. Thus, the ratio of the coupling factors Kt/Kp has been limited to 4 to 6, and spurious response due to overtones determined by the planar coupling factor Kp in the high frequency region have not been negligible.

The present invention has been made to overcome these problems of the prior art and has for its object to provide a piezoelectric oxide material of which the thickness coupling factor Kt is as large as 50% or more; the planar coupling factor Kp is 3 to 5%; the ratio Kt/Kp is 10 to 19; the dielectric constant is as small as 300 or less; sintering is easy, allowing the production of large vibrators of over 50 cm diameter; and poling is easier than that of conventional $PbTiO_3$ materials.

The present invention thus provides a piezoelectric oxide material comprising a basic composition having a general formula

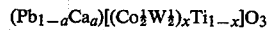

wherein $0.01 \leq X \leq 0.10$ and $0.20 < a \leq 0.35$, to which is added, as an additive, 0.05 to 2.0% by weight based on the basic composition of at least one of MnO, NiO and $Fe_2O_3$; the thickness coupling factor (Kt) is 50% or more; and the ratio (Kt/Kp) of the thickness coupling factor (Kt) to the planar coupling factor (Kp) is 10 or more.

This invention can be more fully understood from the following detailed description when taken in conjunction with the accompanying drawings, in which.

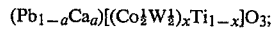

Figure 2:
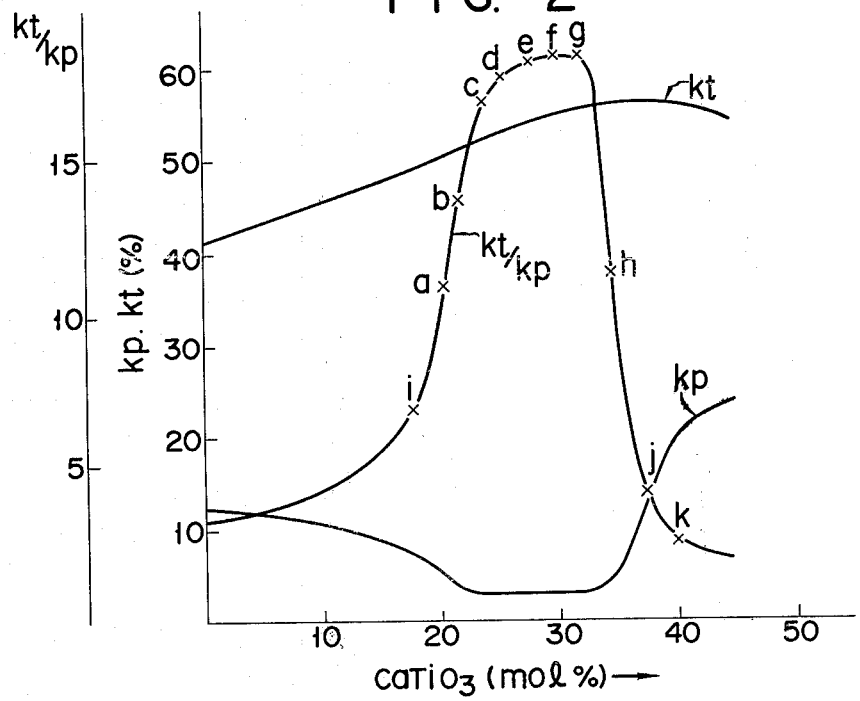
FIG. 2 is a graph showing the relations of the concentration (mol%) of $CaTiO_3$, the electromechanical coupling factors Kt (%), Kp (%), and Kt/Kp in the general formula
Figure 3:
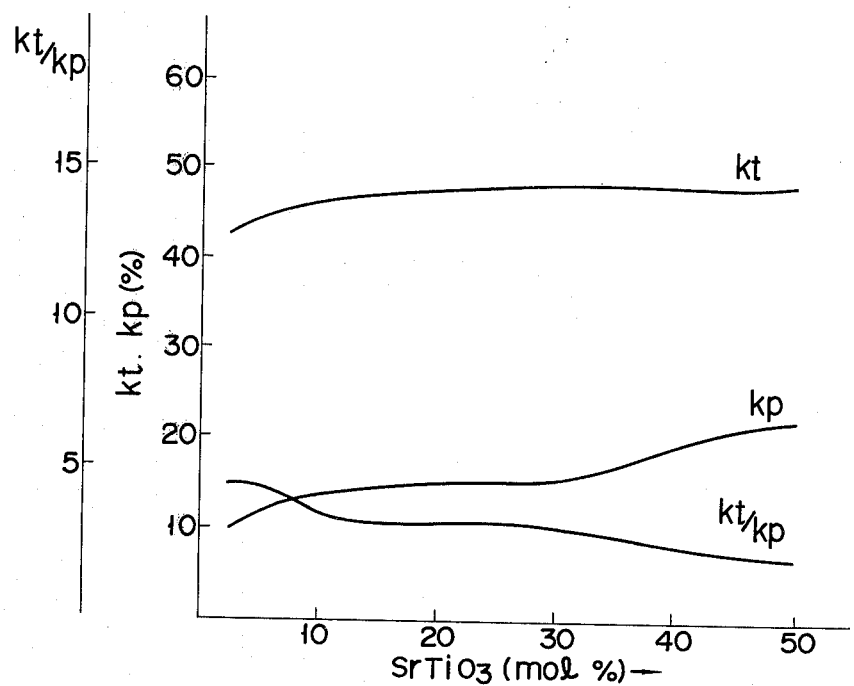
Figure 4:
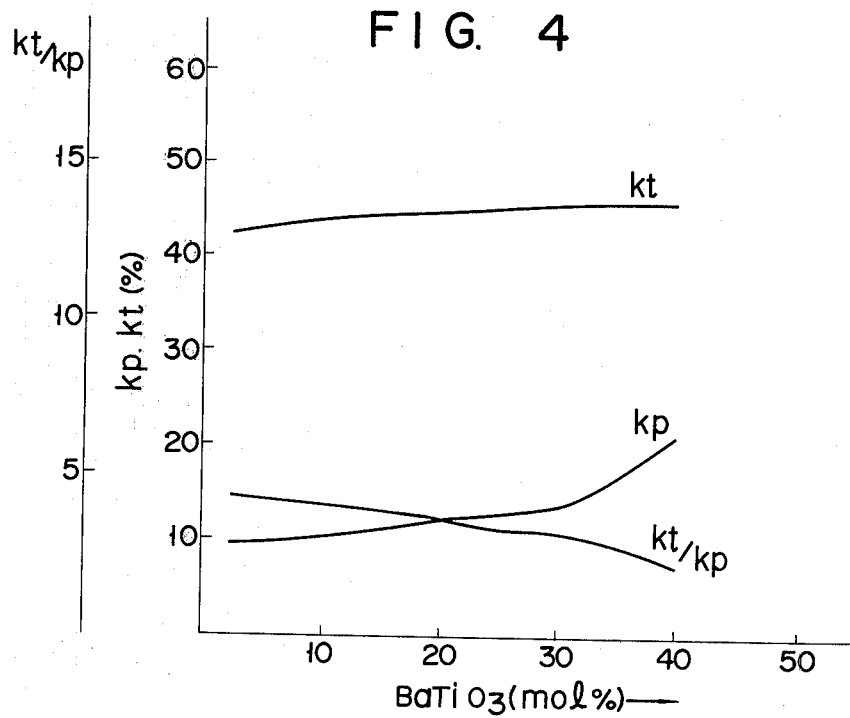
Figure 5:
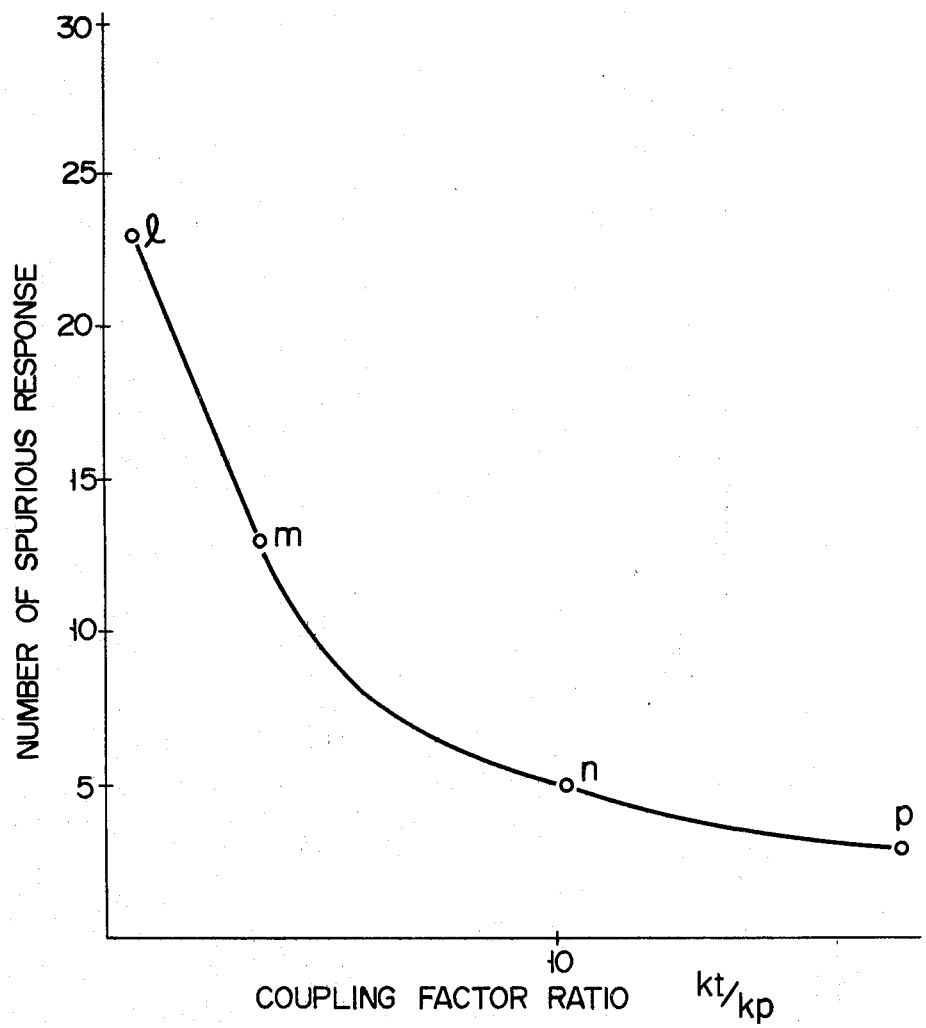

FIGS. 3 and 4 are graphs showing the relations of the Sr and Ba contents, the electromechanical coupling factors Kt (%), Kp (%), and Kt/Kp when Ca in FIG. 2 is replaced with Sr and Ba; and FIG. 5 is a graph showing a relationship between the number of spurious response and the coupling factor ratio of piezoelectric materials.

The reason why $0.20 < a \leq 0.35$ in the basic composition of

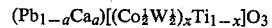

is that the value of Kp exceeds 5% when $a \leq 0.20$ or $a > 0.35$, resulting in the ratio Kt/Kp being less than 10 and leading to frequent spurious response. When $a > 0.35$, the dielectric constant exceeds 300 so that the properties of the composition becomes disadvantageous for use in the high frequency region. The preferred range of "a" is $0.22 \leq a \leq 0.28$.

The reason why X is limited to the range of 0.01 to 0.10 is that the expected effects of

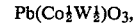

for decreasing the sintering temperature of the ceramic fail to provide uniformly sintered body when $X < 0.01$. When $X > 0.10$, Kp increases so that the ratio Kt/Kp becomes less than 10. The preferred range of "X" is $0.03 \leq X \leq 0.05$.

The reason why the total content of MnO, NiO and $Fe_2O_3$ is limited to 0.05 to 2.0% by weight relative to the total weight of the composition may be explained as follows. When it is less than 0.05% by weight, the expected effects of the additives, i.e., to improve the sintering and the poling characteristics of the $PbTiO_3$ ceramic, are not achieved. When it is more than 2.0%, the sintering of the ceramic becomes difficult. The preferred range of the additives is 0.5 to 1.0% by weight.

The piezoelectric oxide material of the present invention of the type described above may be easily prepared by a conventional powder metallurgical process in general. For example, the raw material oxides, PbO, $TiO_2$, $CaCO_3$, $MnCO_3$, NiO, CoO, $WO_3$, $Fe_2O_3$ and so on are correctly weighed to a predetermined ratio and are mixed well in a ball mill or the like. The another raw materials which are converted to oxides upon heating, for example, hydroxides, carbonates, oxalates may be employable.

The mixture is then calcined at a temperature of about 600° to 900° C. and is ground in a ball mill or the like to prepare a fine powder. After adding a binder such as water and polyvinyl alcohol to this powder, the compact is formed under a pressure of about 0.5 to 2 ton/cm² and is sintered at a temperature of about 1,100° to 1,200° C. Since one component of the composition, PbO, may partially evaporate during this sintering process, the sintering is performed in a closed furnace. The forming compact is usually held at maximum temperature for a period of 0.5 to 3 hours.

Thus, the effects to be described below may be obtained according to the present invention. With the conventional PZT material and the ternary system material, the thickness coupling factor Kt is substantially equal to the planar coupling factor Kp. This results in the practical difficulty of spurious response due to overtones of the vibrations of the planar mode when preparing a vibrator utilizing vibrations in the direction of the thickness. However, with the material of the present invention, the thickness coupling factor Kt is as large as 50% or more but the planar coupling factor Kp is as small as 3 to 5%, so that the spurious response at high frequency region are advantageously reduced to a negligible level. Secondly, by replacing part of the Pb with Ca and by making solid solution with $$Pb(Co_{\frac{1}{2}}W_{\frac{1}{2}})O_3$$

of which sintering temperature is low, the sintering temperature may be reduced and the sintering characteristics of the $PbTiO_3$ type material may be improved so that large ceramic may be obtained.

Furthermore, in the case of the conventional $PbTiO_3$ type material, sufficient value of coupling factor Kt may not be obtained unless an electric field of 60 kV/cm is applied at a high temperature of 200° C. Thus, spark breakdown tends to occur during poling and a large vibrator may not be obtained.

According to the present invention, part of the Pb is replaced with Ca, thus serving to alleviate the poling conditions. Thus, a sufficient large coupling factor Kt may be obtained even under the poling conditions of 100° C. and 30 to 40 kV/cm. Due to this, spark breakdown during the poling is not substantially occurred, so that large vibrators may be produced with stability.

Thirdly, by adding at least one of MnO, NiO and $Fe_2O_3$, the sintering performance, the poling characteristics, and the ageing properties of the resonant frequency may be improved.

Examples of the present invention will now be described.

The sintered sample is polished to a shape of 20 (diameter) × 0.5 mm (thickness). Electrodes are formed on both surfaces of the sample. After poling it under the conditions of 100° C. and 40 kV/cm, the piezoelectric characteristics were respectively measured by the standard circuit method disclosed in Proc. IRE. vol. 137 (1949), pp. 1,378 to 1,395. The results are shown in Table 1 together with the composition ratios of these sintered bodies.

In Table 1, F. T. indicates the sintering temperature (°C.); D, the density (at 23° C.); α, the dielectric constant (at 1 kHz and 23° C.); Kt, the thickness coupling factor (%); Kp, the planar coupling factor (%); and Kt/Kp the ratio of these coupling factors.

TABLE 1

Composition $(Pb_{1-a}Ca_a)[(Co_{\frac{1}{2}}W_{\frac{1}{2}})_xTi_{1-x}]O_3$ + b $\begin{pmatrix} MnO \\ NiO \\ Fe_2O_3 \end{pmatrix}$ % by weight

| Sample No. | $a(\times 10^{-2})$ | $x(\times 10^{-2})$ | $1 - x(\times 10^{-2})$ | b (% by weight) | | F.T. (°C.) | D (g/cm³) | ε | Kt (%) | Kp (%) | Kt/Kp |
|---|---|---|---|---|---|---|---|---|---|---|---|
| Example 1 | 21 | 1 | 99.0 | MnO | 0.5 | 1,140 | 6.91 | 182 | 50.3 | 4.7 | 10.1 |
| Example 2 | 22 | 1 | 99.0 | NiO | 1.0 | 1,140 | 6.89 | 193 | 51.6 | 3.9 | 13.2 |
| Example 3 | 24 | 1 | 99.0 | $Fe_2O_3$ | 2.0 | 1,140 | 6.88 | 196 | 52.2 | 3.5 | 15.0 |
| Example 4 | 26 | 1 | 99.0 | MnO NiO | 1.0 1.0 | 1,140 | 6.86 | 201 | 53.2 | 3.3 | 16.2 |
| Example 5 | 28 | 1 | 99.0 | $Fe_2O_3$ MnO | 0.5 0.5 | 1,140 | 6.82 | 209 | 53.9 | 3.3 | 16.4 |
| Example 6 | 30 | 1 | 99.0 | NiO $Fe_2O_3$ | 0.05 0.05 | 1,140 | 6.79 | 211 | 54.6 | 3.9 | 14.0 |
| Example 7 | 32 | 1 | 99.0 | MnO NiO $Fe_2O_3$ | 0.5 0.5 0.5 | 1,140 | 6.77 | 232 | 55.0 | 4.3 | 12.9 |
| Example 8 | 35 | 1 | 99.0 | MnO NiO $Fe_2O_3$ | 1.0 0.5 0.5 | 1.140 | 6.73 | 266 | 55.5 | 4.9 | 11.4 |
| Comparative Example 1 | 18 | 1 | 99.0 | MnO NiO | 0.5 0.5 | 1,140 | 7.00 | 196 | 47.5 | 7.5 | 6.3 |
| Comparative Example 2 | — | 1 | 99.0 | MnO | 1.0 | 1,140 | 7.90 | 183 | 21.0 | 10.3 | 2.1 |
| Example 9 | 21 | 5.0 | 95.0 | MnO NiO | 0.5 0.5 | 1,140 | 7.01 | 188 | 50.0 | 4.6 | 11.0 |
| Example 10 | 22 | 5.0 | 95.0 | MnO NiO | 0.5 0.5 | 1,140 | 6.96 | 189 | 51.1 | 3.6 | 14.0 |
| Example 11 | 24 | 5.0 | 95.0 | MnO NiO | 0.5 0.5 | 1,140 | 6.92 | 200 | 52.0 | 3.0 | 17.5 |
| Example 12 | 26 | 5.0 | 95.0 | MnO NiO | 0.5 0.5 | 1,140 | 6.90 | 212 | 53.9 | 3.0 | 18.0 |
| Example 13 | 28 | 5.0 | 95.0 | MnO NiO | 0.5 0.5 | 1,140 | 6.83 | 221 | 54.1 | 3.0 | 18.2 |
| Example 14 | 30 | 5.0 | 95.0 | MnO NiO | 0.5 0.5 | 1,140 | 6.79 | 230 | 55.2 | 3.0 | 18.6 |
| Example 15 | 32 | 5.0 | 95.0 | MnO NiO | 0.5 0.5 | 1,140 | 6.79 | 244 | 55.7 | 3.0 | 18.4 |
| Example 16 | 35 | 5.0 | 95.0 | MnO NiO | 0.5 0.5 | 1,140 | 6.77 | 290 | 56.5 | 4.9 | 11.5 |

TABLE 1-continued

Composition $(Pb_{1-a}Ca_a)[(Co_{\frac{1}{2}}W_{\frac{1}{2}})_xTi_{1-x}]O_3 + b\begin{pmatrix}MnO\\NiO\\Fe_2O_3\end{pmatrix}$ % by weight

| Sample No. | a(× 10⁻²) | x(× 10⁻²) | 1 − x(× 10⁻²) | | b (% by weight) | F.T. (°C) | D (g/cm³) | ε | Kt (%) | Kp (%) | Kt/Kp |
|---|---|---|---|---|---|---|---|---|---|---|---|
| Comparative Example 3 | 38 | 5.0 | 95.0 | MnO NiO | 0.5 0.5 | 1,140 | 6.66 | 355 | 57.0 | 12.5 | 4.56 |
| Comparative Example 4 | 40 | 5.0 | 95.0 | MnO NiO | 0.5 0.5 | 1,140 | 6.52 | 726 | 57.0 | 20.0 | 2.85 |
| Example 17 | 21 | 10 | 90 | MnO NiO | 0.5 0.5 | 1,140 | 7.09 | 193 | 50.2 | 4.7 | 10.6 |
| Example 18 | 22 | 10 | 90 | MnO NiO | 0.5 0.5 | 1,140 | 7.01 | 199 | 50.7 | 4.2 | 12.0 |
| Example 19 | 24 | 10 | 90 | MnO NiO | 0.5 0.5 | 1,140 | 6.95 | 211 | 51.2 | 4.2 | 12.2 |
| Example 20 | 26 | 10 | 90 | MnO NiO | 0.5 0.5 | 1,140 | 6.94 | 216 | 51.4 | 3.1 | 16.4 |
| Example 21 | 28 | 10 | 90 | MnO NiO | 0.5 0.5 | 1,140 | 6.92 | 222 | 51.4 | 3.0 | 17.1 |
| Example 22 | 30 | 10 | 90 | MnO NiO | 0.5 0.5 | 1,140 | 6.88 | 232 | 52.7 | 3.7 | 14.3 |
| Example 23 | 32 | 10 | 90 | MnO NiO | 0.5 0.5 | 1,140 | 6.84 | 253 | 53.6 | 4.1 | 13.6 |
| Example 24 | 35 | 10 | 90 | MnO NiO | 0.5 0.5 | 1,140 | 6.80 | 296 | 53.8 | 4.9 | 11.0 |
| Comparative Example 5 | 30 | 0.5 | 99.5 | MnO NiO | 0.5 0.5 | 1,140 | 6.01 | 220 | 39.3 | 5.5 | 7.1 |
| Comparative Example 6 | 30 | 15 | 85 | MnO NiO | 0.5 0.5 | 1,140 | 6.22 | 355 | 48.8 | 12.2 | 4.1 |

Figure 1:
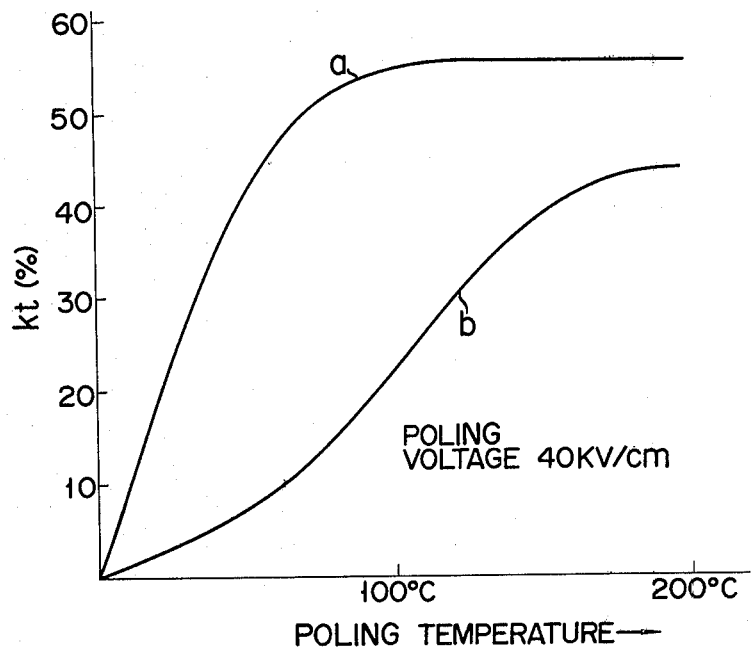
FIG. 1 is a graph showing the relation between the poling temperature and the electromechanical thickness coupling factor Kt.

Among these samples, the dependence of electromechanical coupling factor Kt on the poling temperature was measured for the samples of Example 15 and Comparative Example 2. The results are shown in FIG. 1. Referring to FIG. 1, curve "a" corresponds to Example 15 and curve "b" corresponds to Comparative Example 2. It is seen that, according to the example of the present invention, a sufficient value of coupling factor Kt may be obtained even at a lower temperature and the poling may be attained more easily than for the conventional PbTiO₃ type ceramic.

Among these samples, the dependence of the coupling factors Kt and Kp and the coupling factor ratio Kt/Kp on the concentration of CaTiO₃ (mol%) were measured for the samples of Examples 9, 10, 11, 12, 13, 14, 15 and 16, and Comparative Examples 1, 3 and 4. The results are shown in FIG. 2.

Referring to FIG. 2, the samples a, b, c, d, e, f, g and h correspond to Examples 9, 10, 11, 12, 13, 14, 15 and 16, and the samples i, j and k correspond to Comparative Examples 1, 3 and 4.

As may be apparent from FIG. 2, the thickness coupling factor Kt is as large as 50% or more while the coupling factor Kp is as small as 3 to 5%, so that the coupling factor ratio Kt/Kp reaches 10 to 19 when $0.20 < a \leq 0.35$.

FIG. 3 shows the coupling factors Kt and Kp, and their ratio Kt/Kp of the material in which Sr replaces part of the Pb in PbTiO₃ when X=0.05.

FIG. 4 shows the coupling factors Kt and Kp, and their ratio Kt/Kp of the material in which Ba replaces part of the Pb in PbTiO₃.

As may be apparent from FIGS. 3 and 4, even when Ba or Sr is substituted for part of the Pb in the PbTiO₃, a coupling factor Kt of 50% or more may not be obtained and the coupling factor Kp is 10 to 20%, so that the ratio Kt/Kp is only 5 or less.

However, by replacing 20 to 35 atomic % of the Pb in PbTiO₃ with Ca, the coupling coefficient Kp is reduced to 3 to 5%. A material having such a small Kp and such a large Kt has not yet been reported; thus it constitutes a new piezoelectric oxide material. Since the poling conditions are easy to attain, the production of large vibrators becomes possible and the excellent properties of the PbTiO₃ material may be fully utilized whose application has been heretofore limited.

FIG. 5 is a graph of the number of spurious response that is relative to the coupling factor ratio Kt/Kp. The ceramic vibrators whose resonant frequency are 2.25 MHz at the thickness extensional mode were prepared for the measurement. The number of spurious response were measured from 0.5 MHz to 3 MHz. The spurious responses plotted in the graph represent those having more than 0.5 dB in impedance difference between at the resonant frequency and the anti-resonant frequency. Sample "l" shown in FIG. 5 denotes the piezoelectric material of ordinary ternary system, i.e.,

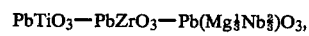

$PbTiO_3-PbZrO_3-Pb(Mg_{\frac{1}{3}}Nb_{\frac{2}{3}})O_3$,

Kt=52%, Kp=49%, Kt/Kp=1.06. Sampel "m" denotes the material of:

$(Pb_{0.80}Sr_{0.20})[(Co_{\frac{1}{2}}W_{\frac{1}{2}})_{0.04}Ti_{0.96}]O_3$, (Kt=48%, Kp=16%, Kt/Kp=3.0). Further, samples "n" and "p" denote Examples 17 and 11 described herein, respectively.

As apparent from FIG. 5, the spurious responses are progressively decreased in accordance with increase in the value of Kt/Kp ratio. To be brief, the piezoelectric material of the present invention generates only a small degree of spurious response. Thus, if the vibration element of an ultrasonic probe is formed of the material of the present invention, the input signal energy supplied to the probe is efficiently converted into the vertical mode ultrasonic wave. In other words, the piezoelectric material of the present invention permits producing a good efficient ultrasonic probe.

The piezoelectric oxide material according to the present invention may be applied in the fields described below:

(1) High frequencies application

Conventional piezoelectric materials have a dielectric constant of about 1,000 which is too large, so they are not suitable for use within the high frequency application. In general, the impedance is given by $Z = d/(2\pi f \cdot \epsilon \cdot s)$ (wherein d, s are the thickness and the cross-sectional area of the sample, respectively; f is the frequency used; and $\epsilon$ is the dielectric constant). The thickness d must be made thinner in inverse proportion of f. Thus, $Z \propto 1/(f^2 \cdot \epsilon \cdot s)$. When f becomes greater, Z is significantly reduced. In order to make impedance matching at high frequency region, it is necessary to make s, or $\epsilon$ small. However, since processing limits are imposed on s, it is advantageous to make $\epsilon$ smaller. The dielectric constant of the present invention is about 180 to 300, which is ⅓ to 1/10 those of conventional piezoelectric materials. If the conventional materials may be used up to 10 MHz, the material of the present invention may be used up to 50 MHz.

Since the coupling factors ratio Kt/Kp is as large as 10 to 19, the adverse effects caused by spurious response due to overtones determined by Kp may be reduced, so that production of the vibrators may be performed advantageously.

(2) Linear scanning type ultrasonic diagnostic probe

For ultrasonic diagnostic probe operating at the high frequency region, the larger and thinner sound conversion element is needed. A large dimensional thinner ceramics vibrator is hard to obtain with conventional $PbTiO_3$ type piezoelectric materials. However, with the material of the present invention, since sintering is easy, a large and thinner ceramic vibrator (e.g., 50 to 10 mm long, 15 to 20 mm wide, and 200 $\mu$m thick) with excellent mechanical strength may be easily obtained.

(3) Metal defect detecting probe

Since the coupling factors ratio (Kt/Kp) of the piezoelectric material of this invention is large, it will be useful to accurately locate any defect in a metallic material.

It is thus understood from the above that the piezoelectric material of the present invention is applicable to fields to which conventional piezoelectric materials have not been applicable heretofore.

What we claim is:

1. A piezoelectric oxide material comprising a basic composition having a general formula

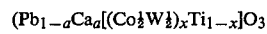
$(Pb_{1-a}Ca_a[(Co_{\frac{1}{2}}W_{\frac{1}{2}})_x Ti_{1-x}]O_3$ wherein $0.01 \leq X \leq 0.10$ and $0.20 < a \leq 0.35$, and an additive, of 0.05 to 2.0% by weight of at least one of MnO, NiO and $Fe_2O_3$ based on the total content of the basic composition; said material exhibiting a thickness coupling factor (Kt) of 50% or more; and a ratio (Kt/Kp) of the thickness coupling factor (Kt) to the planar coupling factor (Kp) of 10 or more.

2. A piezoelectric oxide material according to claim 1, wherein $0.03 \leq X \leq 0.05$.

3. A piezoelectric oxide material according to claim 1, wherein $0.22 \leq a \leq 0.28$.

4. A piezoelectric oxide material according to claim 1, wherein the additive content is 0.5 to 1.0% by weight based on the total content of the basic composition.

* * * * *